(12) United States Patent
Yu et al.

(10) Patent No.: US 11,177,369 B2
(45) Date of Patent: Nov. 16, 2021

(54) STACKED VERTICAL FIELD EFFECT TRANSISTOR WITH SELF-ALIGNED JUNCTIONS

(71) Applicant: International Business Machines Corporation, Armonk, NY (US)

(72) Inventors: Lan Yu, Voorheesville, NY (US); Xin Miao, Slingerlands, NY (US); Chen Zhang, Albany, NY (US); Heng Wu, Guilderland, NY (US); Kangguo Cheng, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 55 days.

(21) Appl. No.: 16/582,790

(22) Filed: Sep. 25, 2019

(65) Prior Publication Data
US 2021/0091207 A1   Mar. 25, 2021

(51) Int. Cl.
| | |
|---|---|
| *H01L 27/11* | (2006.01) |
| *H01L 29/66* | (2006.01) |
| *H01L 29/423* | (2006.01) |
| *H01L 21/02* | (2006.01) |
| *H01L 29/78* | (2006.01) |
| *H01L 29/06* | (2006.01) |

(52) U.S. Cl.
CPC .. *H01L 29/66666* (2013.01); *H01L 21/02639* (2013.01); *H01L 29/0653* (2013.01); *H01L 29/4238* (2013.01); *H01L 29/7831* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,612,563 A | * | 3/1997 | Fitch | ............... H01L 21/76897 |
| | | | | 257/329 |
| 8,735,975 B2 | | 5/2014 | Erickson | |
| 9,525,064 B1 | * | 12/2016 | Balakrishnan | ...... H01L 29/0847 |
| 9,647,123 B1 | | 5/2017 | Balakrishnan | |

(Continued)

OTHER PUBLICATIONS

"Method and Structure for Stacking of Vertical Transistors and Gate-All-Around Transistors on Bulk Substrate", An ip.com Prior Art Database Technical Disclosure, Disclosed Anonymously, ip.com No. IPCOM000255869D, ip.com Electronic Publication Date: Oct. 17, 2018, 11 pages.

*Primary Examiner* — Ali Naraghi
(74) *Attorney, Agent, or Firm* — Michael A. Petrocelli

(57) ABSTRACT

A method of forming a semiconductor device and resulting structure in which a trench is formed extending through a plurality of layers on a semiconductor substrate. The plurality of layers includes a sequence of dielectric materials. A first portion of the plurality of layers corresponds to a bottom vertical field effect transistor (VFET) and a second portion of the plurality of layers corresponds to a top VFET. A sacrificial layer separates the bottom VFET from the top VFET. A fin is formed within the trench by epitaxially growing a semiconductor material. A hard mask is formed above a central portion of the plurality of layers. Portions of the plurality of layers not covered by the hard mask are removed. The first portion of the plurality of layers is covered to remove the sacrificial layer. The recess resulting from the removal of the sacrificial layer is filled with an oxide material.

18 Claims, 11 Drawing Sheets

(56) References Cited

U.S. PATENT DOCUMENTS

| | | | | |
|---|---|---|---|---|
| 9,831,131 | B1* | 11/2017 | Jacob | H01L 29/66439 |
| 10,084,081 | B2 | 9/2018 | Cheng | |
| 10,217,665 | B2* | 2/2019 | Masuoka | H01L 21/76897 |
| 10,651,180 | B2* | 5/2020 | Masuoka | H01L 21/28114 |
| 2006/0128088 | A1 | 6/2006 | Graham | |
| 2011/0012085 | A1 | 1/2011 | Deligianni | |
| 2016/0204251 | A1* | 7/2016 | Masuoka | H01L 21/823842 257/329 |
| 2017/0323977 | A1* | 11/2017 | Cheng | H01L 21/2252 |
| 2018/0277442 | A1 | 9/2018 | Leobandung | |
| 2018/0350799 | A1* | 12/2018 | Ho | H01L 28/20 |
| 2019/0275796 | A1* | 9/2019 | Miwa | B41J 2/1623 |

* cited by examiner

STACKED VERTICAL FIELD EFFECT TRANSISTOR WITH SELF-ALIGNED JUNCTIONS

BACKGROUND

The present invention generally relates to the field of semiconductor devices, and more particularly to a method of forming stacked vertical field-effect transistors (VFETs).

VFETs have been pursued as a potential device option for scaling complementary metal-oxide semiconductors (CMOS) to the 5 nanometer (nm) node and beyond. As opposed to planar CMOS devices, VFETs are oriented vertically with a vertical fin or nanowire that extends upward from the substrate. The fin or nanowire forms the channel region of the transistor. A source region and a drain region are situated in electrical contact with the top and bottom ends of the channel region, while the gate is disposed on one or more of the fin or nanowire sidewalls. Thus, in VFETs the direction of the current flow between the source and drain regions is normal to the main surface of the substrate.

Stacking field-effect transistors (FETs) in the vertical direction gives an additional dimension for CMOS area scaling. However, it can be very challenging to stack planar FETs. VFETs unique structure can facilitate the stacking process. Therefore, stacked VFET designs and techniques for formation thereof would be desirable.

SUMMARY

Shortcomings of the prior art are overcome and additional advantages are provided through the provision of a method of forming a semiconductor structure that includes forming a trench within a plurality of layers stacked on a semiconductor substrate, the plurality of layers includes a sequence of dielectric materials, the trench extends through each layer of the plurality of layers until a top portion of the semiconductor substrate. A first portion of the plurality of layers corresponds to a bottom vertical field effect transistor (VFET) device and a second portion of the plurality of layers corresponds to a top VFET device. The bottom VFET device is separated from the top VFET device by a second sacrificial layer of the plurality of layers. A semiconductor material is epitaxially grown within the trench to form a fin. A hard mask layer is formed above a central top portion of the plurality of layers, the hard mask layer covers the fin. Lateral portions of the plurality of layers outside the hard mask layer are removed in a way such that a width of a remaining portion of the plurality of layers below the hard mask layer is equal to a width of the hard mask. The first portion of the plurality of layers associated with the bottom VFET is covered, and the second sacrificial layer separating the first portion of the plurality of layers from the second portion of the plurality of layers is removed, where removing the second sacrificial layer creates a recess between the bottom VFET and the top VFET that is subsequently filled with an oxide material.

Another embodiment of the present disclosure provides a semiconductor structure that includes a bottom portion of a fin including a vertical fin channel of a bottom vertical field effect transistor (VFET) disposed on a semiconductor substrate, bottom source-drain regions of the bottom VFET located on opposite sides of the vertical fin channel of the bottom VFET, a metal gate of the bottom VFET disposed alongside the vertical fin channel of the bottom VFET, a top portion of the fin including a vertical fin channel of a top VFET, top source-drain regions of the top VFET located on opposite sides of the vertical fin channel of the top VFET, a metal gate of the top VFET disposed alongside the vertical fin channel of the top VFET, and an oxide layer separating the top VFET from the bottom VFET.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
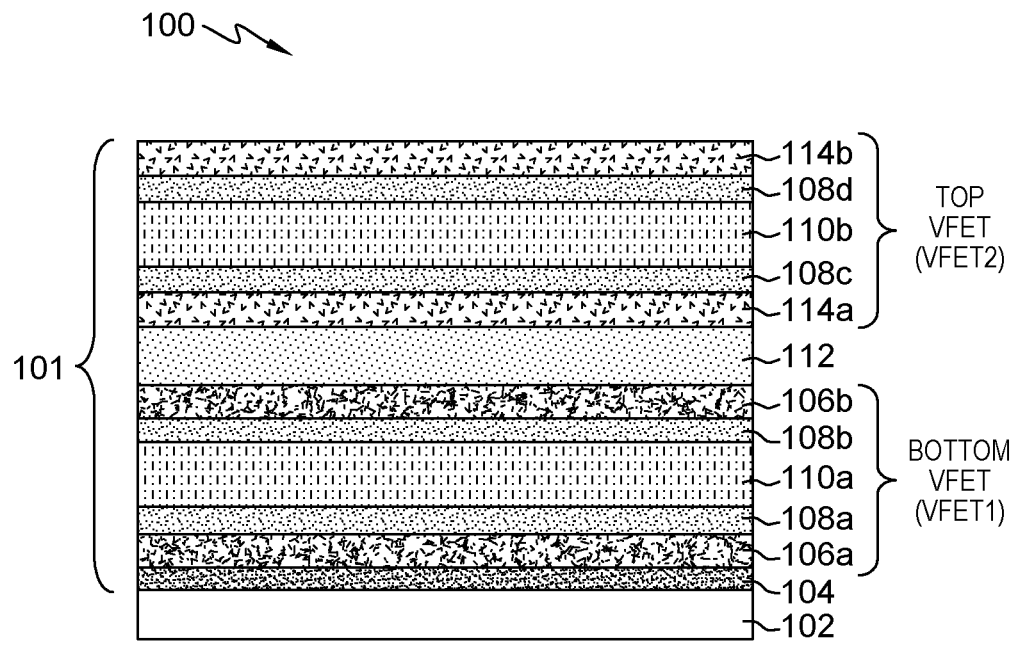
FIG. 1 is a front view of a semiconductor structure including a plurality of layers vertically stacked on a semiconductor substrate, according to an embodiment of the present disclosure.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Typical VFET layouts include vertical n-type field-effect transistors (NFETs) and p-type field-effect transistors (PFETs) side-by-side one another on a semiconductor substrate. Embodiments of the present disclosure provide a method and associated structure for vertically stacking NFETs and PFETs. Accordingly, in addition to the vertical orientation of the VFET structure, the present stacked VFET design provides another dimension for complementary metal-oxide-semiconductor (CMOS) area scaling.

The present invention generally relates to the field of semiconductor devices, and more particularly to a method of forming stacked VFETs. An embodiment by which a stacked VFET device can be formed is described in detailed below by referring to the accompanying drawings in FIGS. 1-17B. The stacked VFET design includes an NFET and a PFET stacked in either order. Namely, configurations are contemplated herein where either the NFET or the PFET is present at the bottom and top of the stack. Thus, both NFET stacked on PFET and PFET stacked on NFET designs are described herein. As such, in the description that follows, reference will be made to a bottom VFET in the stack and a top VFET in the stack. The bottom VFET can be either an NFET or a PFET. Likewise, the top VFET can be either an NFET or a PFET. For clarity, the designations "first VFET" or "VFET1" and "second VFET" or "VFET2" may also be used herein to refer to the bottom and top VFETs, respectively.

Referring now to FIG. 1, a front view of a semiconductor structure 100 including a plurality of layers 101 formed on a semiconductor substrate 102 is shown, according to an embodiment of the present disclosure. In the depicted embodiment, the semiconductor substrate (hereinafter referred to as "substrate") 102 may be formed of silicon (Si), although other suitable materials may be used. The substrate 102 may include any suitable substrate structure, e.g., a silicon bulk substrate. In other embodiments, the substrate 102 can include a silicon-containing material. Illustrative examples of silicon-containing materials suitable for the substrate 102 may include, but are not limited to, silicon germanium (SiGe) and multi-layers thereof. Although silicon is the predominantly used semiconductor material in wafer fabrication, alternative semiconductor materials can be employed as additional layers, such as, but not limited to, germanium (Ge), gallium arsenide (GaAs), indium gallium arsenide (InGaAs), cadmium telluride (CdTe), zinc selenide (ZnSe), etc. The substrate 102 may have a width or horizontal thickness selected as desired based on a number of fins or other features to be formed thereon. In an exemplary embodiment, the substrate 102 may have a height or vertical thickness ranging from approximately 20 nm to approximately 500 nm, although other heights above or below this range may be used as desired for a particular application.

A plurality of layers 101 may be formed on a top surface of the substrate 102, as depicted in the figure. According to an embodiment, the plurality of layers 101 may include a sequence of dielectric materials vertically stacked on the substrate 102. More specifically, the plurality of layers 101 are sequentially deposited on the substrate 102.

The process of forming the plurality of layers 101 on the substrate 102 may start by depositing a bottom dielectric layer 104 directly above the substrate 102. The bottom dielectric layer 104 separates subsequently formed VFET device(s) from the substrate 102.

The bottom dielectric layer 104 may include any dielectric material such as silicon oxide, silicon nitride, silicon oxynitride, a low-k material, or any combination thereof. The bottom dielectric layer 104 may be formed by any suitable deposition method known in the art including, for example, high density plasma (HDP), chemical vapor deposition (CVD), or physical vapor deposition (PVD). According to an embodiment the bottom dielectric layer 104 may have a thickness ranging from approximately 5 nm to approximately 200 nm. Preferably, the bottom dielectric layer 104 may have a thickness ranging from approximately 10 nm to approximately 50 nm.

It should be noted that the position of the bottom dielectric layer 104 at the bottom of the plurality of layers 101 to separate the VFET device(s) from the substrate, may later be used to perform substrate removal and transfer.

A first bottom dopant layer 106a for the bottom VFET (VFET1) is formed directly above the bottom dielectric layer 104. The first bottom dopant layer 106a together with a subsequently formed first top dopant layer 106b will be used in later processing steps to form source-drain regions (not shown) of the bottom VFET. Specifically, the first bottom dopant layer 106a and the first top dopant layer 106b of the bottom VFET may act as a dopant source during subsequent processing steps for driving dopants into top and bottom portions of a fin (e.g., fin 304 in FIG. 3) to form source-drain regions of the bottom VFET device, as will be described in detail below.

In an exemplary embodiment the first bottom dopant layer 106a may have a thickness ranging from approximately 20 nm to approximately 100 nm. Preferably, the first bottom dopant layer 106a may have a thickness ranging from approximately 30 nm to approximately 50 nm.

According to an embodiment, the first bottom dopant layer 106a may include any suitable silicate glass selected based on a polarity of the bottom VFET. For example, in embodiments in which the bottom VFET is an NFET device, the first bottom dopant layer 106a may be a phosphosilicate glass (PSG) or an arsenic silicate glass (ASG), whereas in embodiments in which the bottom VFET is a PFET device, the first bottom dopant layer 106a may be a borosilicate glass (BSG).

Subsequently, a first bottom spacer 108a for the bottom VFET (VFET1) may be deposited above and in direct contact with the first bottom dopant layer 106a. The first bottom spacer 108a together with subsequently formed first top bottom spacer 108b, second bottom spacer 108c and second top spacer 108d may function as a protective barrier to preserve subsequently formed fin 304 (FIG. 3) during downstream manufacturing steps, but most importantly, the first bottom spacer 108a together with the subsequently formed first top bottom spacer 108b, second bottom spacer 108c and second top spacer 108d may define or determine a location of p-n junctions in the semiconductor structure 100.

Suitable materials for the first bottom spacer 108a may include, but are not limited to, silicon nitride (SiN), silicon dioxide (SiO$_2$) and/or silicon oxycarbide (SiOC). The first bottom spacer 108a may be formed by any suitable deposition method known in the art. Typically, the first bottom spacer 108a may have a height or vertical thickness ranging from approximately 4 nm to approximately 12 nm. In an embodiment, the first bottom spacer 108a may have a height ranging from approximately 4 nm to approximately 8 nm.

It should be noted that the subsequently formed first top bottom spacer 108b, second bottom spacer 108c and second top spacer 108d include analogous materials and are formed in a similar way as the first bottom spacer 108a, as will be described in detail below.

A first sacrificial layer 110a is formed in the bottom VFET (VFET1) directly above the first bottom spacer 108a. The first sacrificial layer 110a may be replaced during subsequent processing steps with corresponding work function metals for the bottom VFET. The first sacrificial layer 110a may include any suitable dielectric material such as, for example, silicon oxycarbide (SiOC) or amorphous silicon (a-Si). In an exemplary embodiment, the first sacrificial layer 110a may include silicon oxycarbide deposited using a plasma-enhanced CVD (PECVD) process.

The process continues by forming a first top spacer 108b directly above the first sacrificial layer 110a. The first top spacer 108b is made by the same materials and formed similarly to the first bottom spacer 108b of the bottom VFET (VFET1). As mentioned above, together the first bottom spacer 108a and top spacer 108b may protect portions of the fin 304 (FIG. 3) in the bottom VFET during subsequent manufacturing steps and define the location of p-n junctions.

Then, a first top dopant layer 106b may be formed directly above the first top spacer 108b. The first top dopant layer 106b is made of the same materials and is formed similarly to the first bottom dopant layer 106a. As mentioned above, together the first top dopant layer 106b and the first bottom dopant layer 106a are used for doping top and bottom regions of the fin 304 (FIG. 3) in the bottom VFET (VFET1).

With continued reference to FIG. 1, a second sacrificial layer 112 is formed in the semiconductor structure 100. The second sacrificial layer 112 may be formed above and in direct contact with the first top dopant layer 106b. The second sacrificial layer 112 separates the bottom VFET (VFET1) from the top VFET (VFET2). The second sacrificial layer 112 may include any dielectric material such as silicon oxide, silicon nitride, silicon oxynitride, a low-k material, or any combination thereof. The second sacrificial layer 112 may be formed by any suitable deposition method known in the art including, for example, HDP, CVD, or PVD. According to an embodiment the second sacrificial layer 112 may have a thickness ranging from approximately 30 nm to approximately 200 nm. Preferably, the second sacrificial layer 112 may have a thickness ranging from approximately 50 nm to approximately 100 nm.

The manufacturing process continues by forming layers of the plurality of layers 101 corresponding to the top VFET (VFET2). Specifically, a stacked of layers including a second bottom dopant layer 114a, a second bottom spacer 108c, a third sacrificial layer 110b, a second top bottom spacer 108d, and a second top dopant layer 114b are sequentially deposited above the second sacrificial layer 112. The second bottom dopant layer 114a and second top dopant layer 114b are formed similarly to the first bottom dopant layer 106a and first top dopant layer 106b.

As may be understood by those skilled in the art, in embodiments in which the bottom VFET (VFET1) is an NFET device, the top VFET (VFET2) is a PFET device. In such embodiments, the second bottom dopant layer 114a and second top dopant layer 114b may include a borosilicate glass (BSG). In contrast, in embodiments in which the bottom VFET is a PFET device, the top VFET is an NFET device with second bottom dopant layer 114a and second top dopant layer 114d made of phosphosilicate glass (PSG) or arsenic silicate glass (ASG).

The second bottom spacer 108c, second top spacer 108d, and third sacrificial layer 110b include analogous materials and are formed similarly to the first bottom spacer 108a, first top spacer 108b, and first sacrificial layer 110a, respectively.

Figure 2:
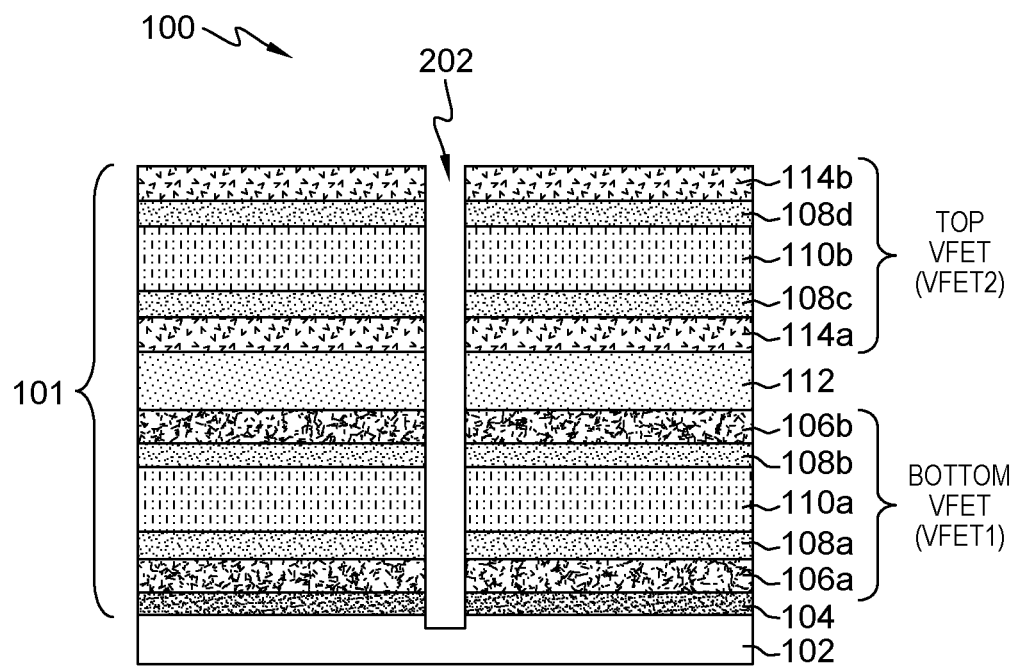
FIG. 2 is a front view of the semiconductor structure depicting forming a trench in the plurality of layers, according to an embodiment of the present disclosure.

Referring now to FIG. 2, a trench 202 is formed in the plurality of layers 101, according to an embodiment of the present disclosure. The trench 202 vertically crosses all of the plurality of layers 101 and a top portion of the substrate 102. The trench 202 may subsequently be filled with a semiconductor material to form a fin 304 on the semiconductor structure 100, as will be described below in FIG. 3.

In an exemplary embodiment, the trench 202 may have a width or horizontal thickness ranging from approximately 5 nm to approximately 10 nm, although other heights above or below this range may be used as desired for a particular application. In general, dimensions of the trench 202 are selected based on design characteristics of the VFET device. Specifically, the number and dimensions of fins. As known by those skilled in the art, in VFETs architecture the fins (e.g., fin 304 in FIG. 3) form the channel region (not shown) of the VFET device, while source-drain regions (not shown) are formed in contact with the top and bottom ends of the channel region. The trench 202 may be formed by, for example, using an anisotropic etching technique such as reactive ion etching (RIE).

It should be noted that the etching process to form the trench 202 continues into the substrate 102, as shown in the figure. By doing so, a beginning of a high defect epi to may be buried in the substrate 102 and not in the channel region (not shown) of the VFET device(s).

It should be noted that an aspect ratio trapping (ART) technique may facilitate the proposed process flow. As known by those skilled in the art, ART uses high aspect ratio sub-micron trenches to trap threading dislocations which may greatly reduce a dislocation density of lattice mismatched materials grown on silicon.

Figure 3:
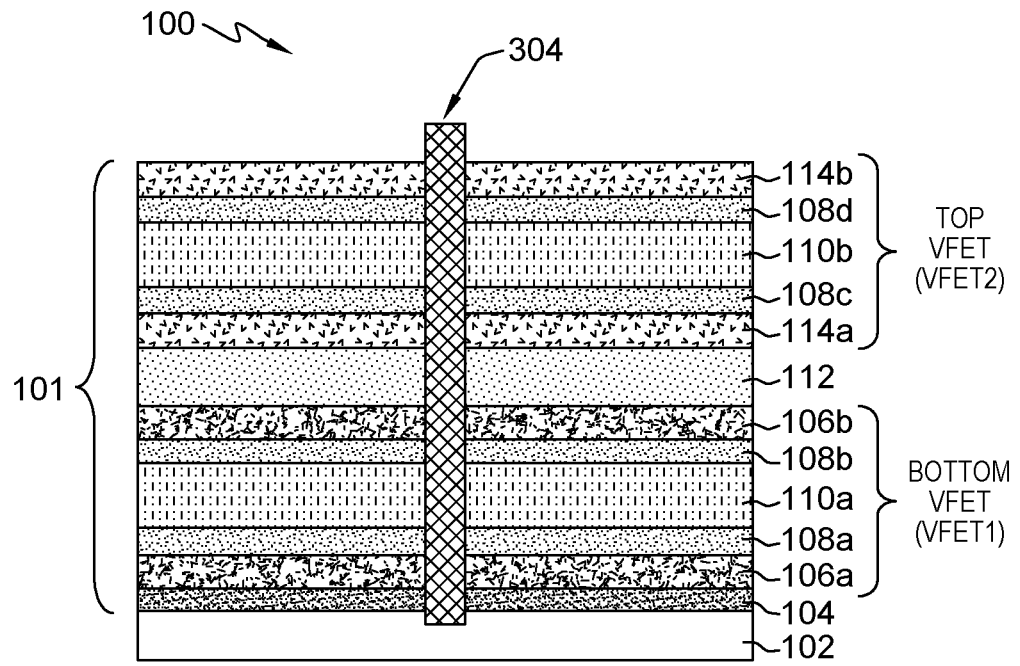
FIG. 3 is a front view of the semiconductor structure depicting forming a fin in the semiconductor structure, according to an embodiment of the present disclosure.

Referring now to FIG. 3, a fin 304 is formed in the semiconductor structure 100, according to an embodiment of the present disclosure. The fin 304 may be epitaxially grown within the trench 202 (FIG. 3) by suitable epitaxial growth processes. As previously explained, the fin 304 may form the channel region of the bottom VFET device and top VFET device. In this embodiment, the fin 304 may include silicon. In another embodiment the fin 304 may include silicon germanium. As explain above, dimensions of the fin 304 are determined by the trench 202 (FIG. 2).

Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RT-CVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from 500° C. to 900° C. Although higher temperature typically results in faster deposition, the faster deposition may result in crystal defects and film cracking.

A number of different precursors may be used for the epitaxial growth of the fin 304. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Figure 4:
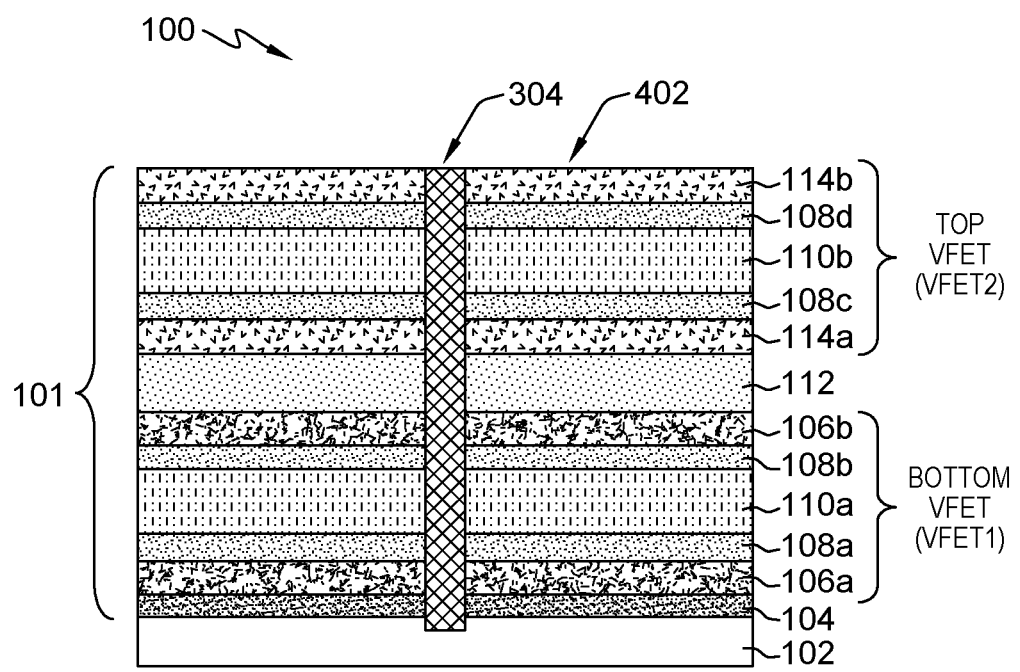
FIG. 4 is a front view of the semiconductor structure depicting planarizing a top surface of the plurality of layers and the fin, according to an embodiment of the present disclosure.

Referring now to FIG. 4, after forming the fin 304, a planarization process is performed on the semiconductor structure 100 to remove any excess material from a top surface 402 of the plurality of layers 101, according to an embodiment of the present disclosure. The planarization process may be, for example, a chemical mechanical polishing (CMP) process.

Figure 5:
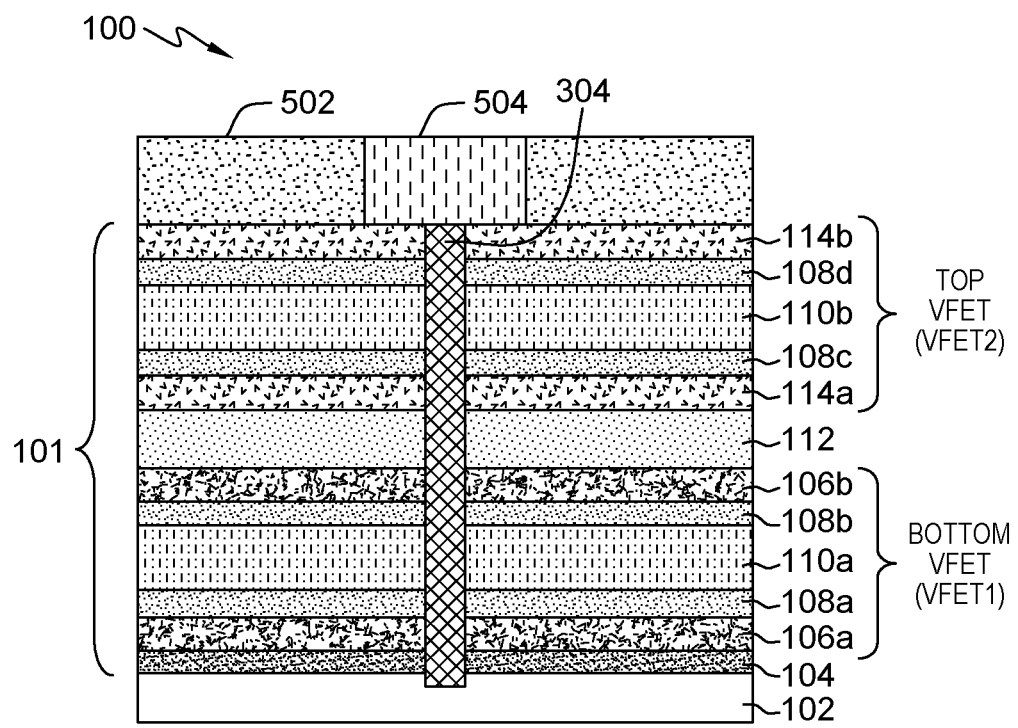
FIG. 5 is a front view of the semiconductor structure depicting forming an upper sacrificial layer on the plurality of layers and the fin, according to an embodiment of the present disclosure.

Referring now to FIG. 5, an upper sacrificial layer 502 is formed on the plurality of layers 101, according to an embodiment of the present disclosure. A central portion 504 of the upper sacrificial layer 502 covers the fin 304 and inner portions of the plurality of layers 101. The upper sacrificial layer 502 may include any suitable dielectric material deposited using standard techniques. In an exemplary embodiment, the upper sacrificial layer 502 may include silicon dioxide ($SiO_2$) which may facilitate selective removal of the central portion 504, as will be described in detailed below.

In an exemplary embodiment, the upper sacrificial layer 502 including the central portion 504 may have a (vertical) thickness of approximately 30 nm to approximately 100 nm. The central portion 504 may have a width or horizontal thickness of approximately 30 nm to approximately 100 nm.

Figure 6:
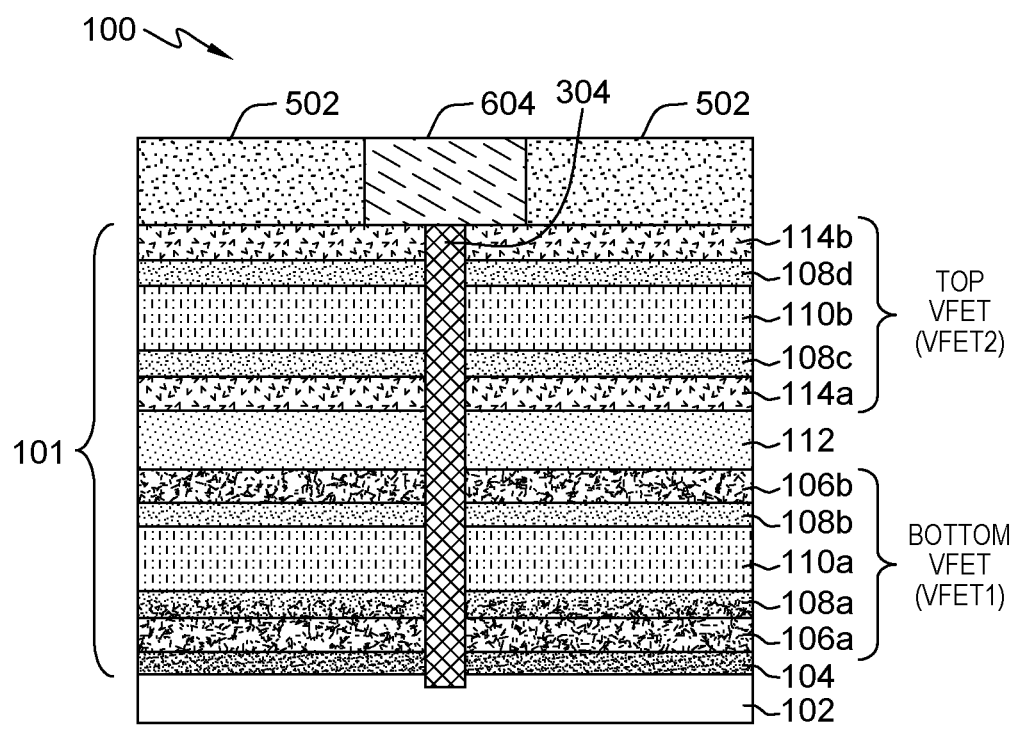
FIG. 6 is a front view of the semiconductor structure depicting forming a hard mask layer, according to an embodiment of the present disclosure.

Referring now to FIG. 6, the central portion 504 (FIG. 5) of the upper sacrificial layer 502 is selectively removed from the semiconductor structure 100 to form a hard mask 604, according to an embodiment of the present disclosure. The central portion 504 (FIG. 5) of the upper sacrificial layer 502 may be selectively removed by, for example, hot SC1 or vapor-phase HCl at high temperature.

After removing the central portion 504 of the upper sacrificial layer 502, a hard mask 604 is formed within the remaining space (not shown). The hard mask 604 may protect the fin 304 and underlying layers of the plurality of layers 101 during subsequent processing steps. Moreover, a width of the hard mask 604 may determine a final width or horizontal thickness of the plurality of layers 101, and hence of the bottom VFET and top VFET.

The hard mask 604 may be formed of silicon nitride (SiN), although other suitable materials such as silicon oxide (SiOX), silicon dioxide (SiO2) and silicon oxynitride (SiON) may be used. The hard mask 604 may be formed by any suitable deposition method known in the art. The hard mask 604 may have a height or vertical thickness similar to that of the upper sacrificial layer 502, although other heights above or below this range may be used as required for a particular application. The semiconductor structure 100 may be planarized after forming the hard mask 604 by any known planarization process. In some embodiments, the planarization process may be performed until a top surface of the hard mask 604 and a top surface of the remaining outer portions of the upper sacrificial layer 502 are substantially co-planar, as shown in the figure.

Figure 7:
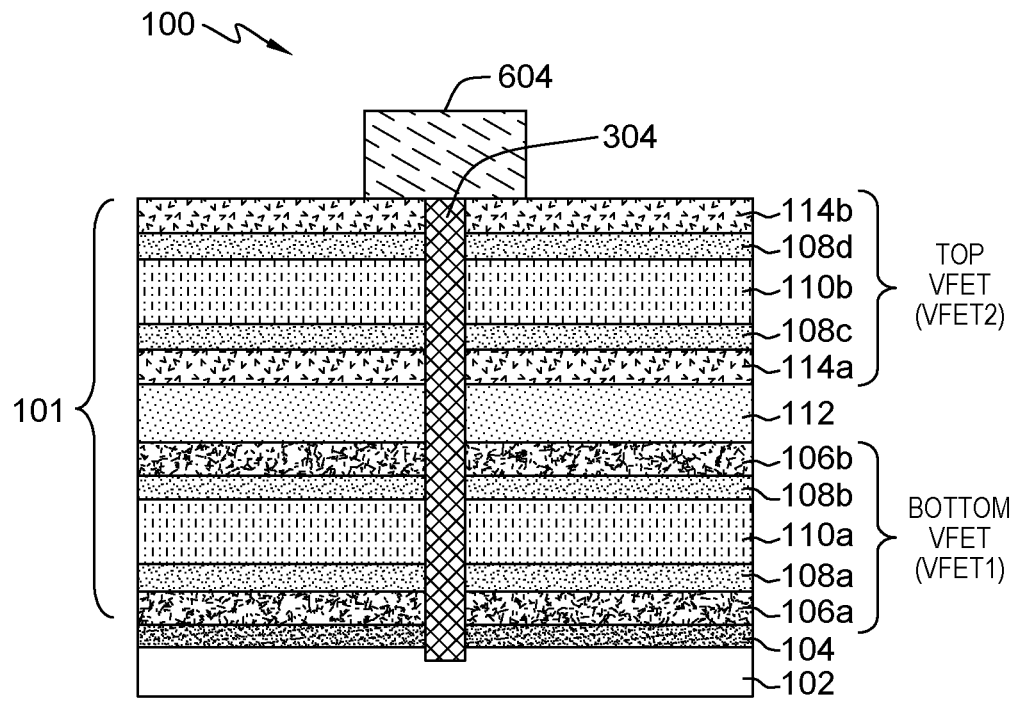
FIG. 7 is a front view of the semiconductor structure depicting removing portions of the upper sacrificial layer from above the plurality of layers, according to an embodiment of the present disclosure.

Referring now to FIG. 7, remaining portions of the upper sacrificial layer 502 are removed from the semiconductor structure 100, according to an embodiment of the present disclosure. The remaining portions of the upper sacrificial layer 502 adjacent to the hard mask 604 may be selectively removed from the semiconductor structure 100 by any suitable etching technique. For example, in embodiments in which the remaining portions of the upper sacrificial layer 502 are made of silicon dioxide ($SiO_2$) and the hard mask 604 is made of silicon nitride (SiN), a buffered oxide etch, also known as buffered HF or BHF, may be used to selectively remove the remaining portion of the upper sacrificial layer 502. The removal of the remaining portions of the upper sacrificial layer 502 uncovers (outer) portions of the plurality of layers 101.

Figure 8:
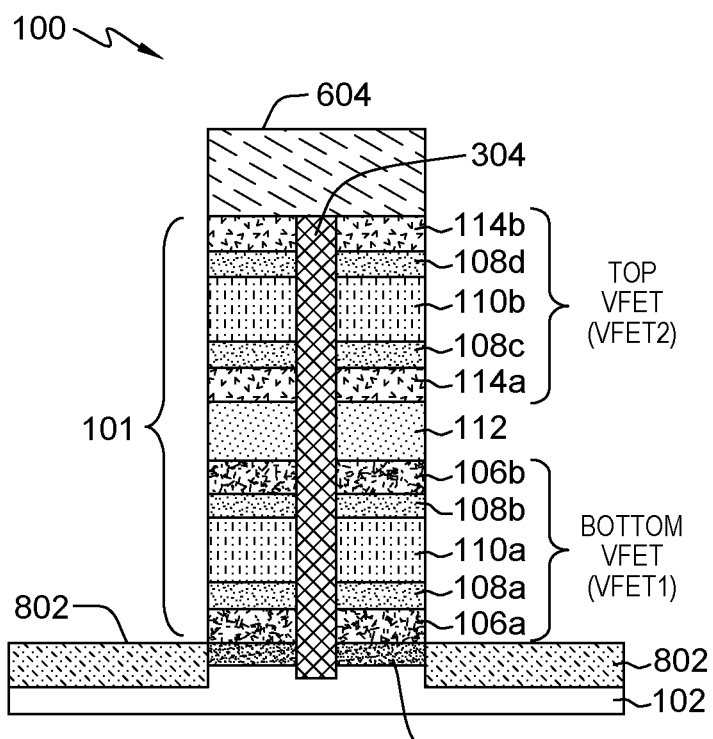
FIG. 8 is a front view of the semiconductor structure depicting etching the plurality of layers and the semiconductor substrate to form shallow trench isolation regions, according to an embodiment of the present disclosure.

Referring now FIG. 8, portions of the plurality of layers 101 not covered by the hard mask 604 are removed from the semiconductor structure 100 to form shallow trench isolation (STI) regions 802 in the substrate 102, according to an embodiment of the present disclosure.

Any known etching technique may be used to remove the portions of the plurality of layers 101 prior to forming the STI regions 802. In some embodiment, the same etching technique can be used to remove the portions of the plurality of layers 101 and form the STI regions 802. As known by those skilled in the art, STI regions 802 are frequently used in semiconductor technology to separate active regions within the substrate 102 and prevent electric current leakage between adjacent components. The process of forming the STI regions 802 is well known in the art, and generally include etching the substrate 102 to create recesses (not shown) that may later be filled with an insulator material using any deposition method known in the art. In an exemplary embodiment, the STI regions 802 may consist of any low-k dielectric material including, but not limited to: silicon nitride, silicon oxide, silicon oxy-nitride and fluoride-doped silicate glass.

Figure 9A:
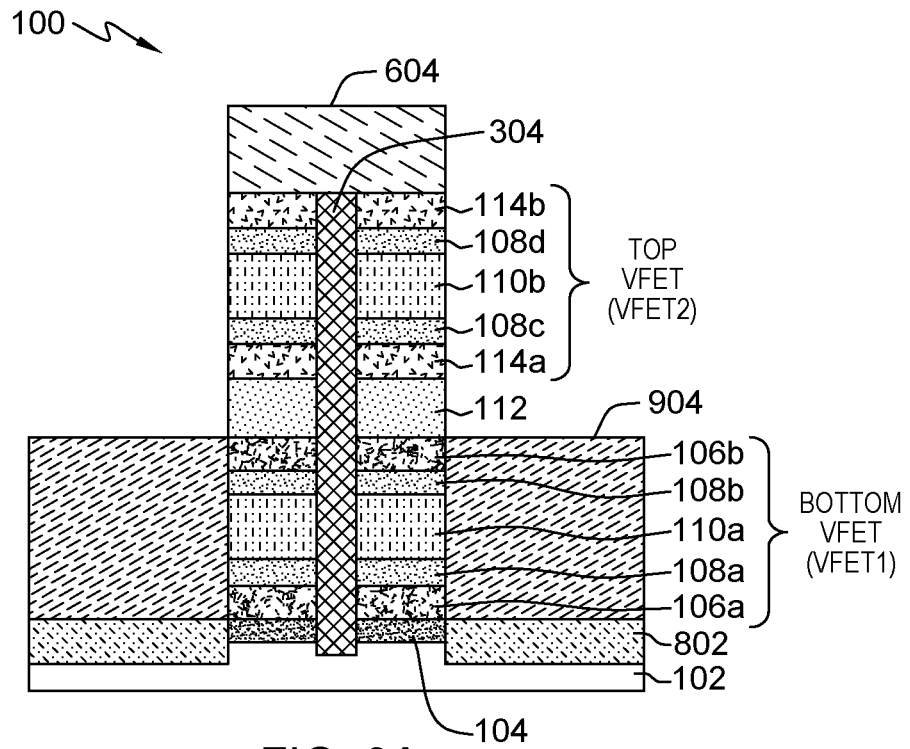
FIG. 9A is a front view of the semiconductor structure depicting depositing a first oxide layer to cover a bottom portion of the plurality of layers corresponding to a first VFET device, according to an embodiment of the present disclosure.
Figure 9B:
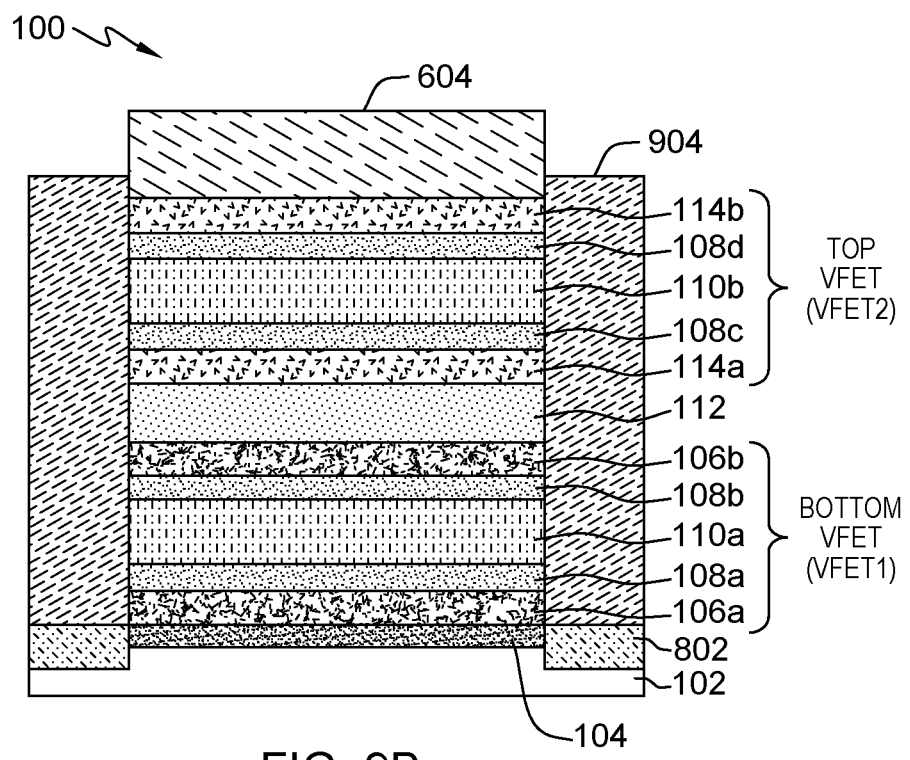
FIG. 9B is a lateral or side view of FIG. 9A, according to an embodiment of the present disclosure.

Referring now to FIG. 9A, a front view of the semiconductor structure 100 is shown depicting the deposition of a first oxide layer 904 to cover the bottom VFET, according to an embodiment of the present disclosure. FIG. 9B is a lateral view of the semiconductor structure 100. The first oxide layer 904 may protect the bottom VFET during removal of the second sacrificial layer 112, as will be described below in FIGS. 10A-10B. As can be appreciated in FIG. 9B, the oxide layer 904 may also provide structural support to the semiconductor structure 100 during subsequent processing steps.

In an exemplary embodiment, the first oxide layer 904 may be made of silicon oxide (SiOX), although other materials may be considered. The first oxide layer 904 may be deposited in the semiconductor structure 100 by any suitable deposition method known in the art. According to an embodiment, the first oxide layer 904 may subsequently be patterned and etched to expose the second sacrificial layer 112. An etching technique such as, for example, RIE, may be used to remove portions of the first oxide layer 904 from the semiconductor structure 100 (FIG. 9A) and expose the second sacrificial layer 112, while remaining portions of the first oxide layer 904 provide support to the semiconductor structure 100, and more particularly to the fin 304 after removal of the second sacrificial layer 112, as will be described in FIGS. 10A-10B. In some embodiments, a half-way self-aligned process combining the hard mask 604 and patterning can be performed to form the first oxide layer 904.

Figure 10A:
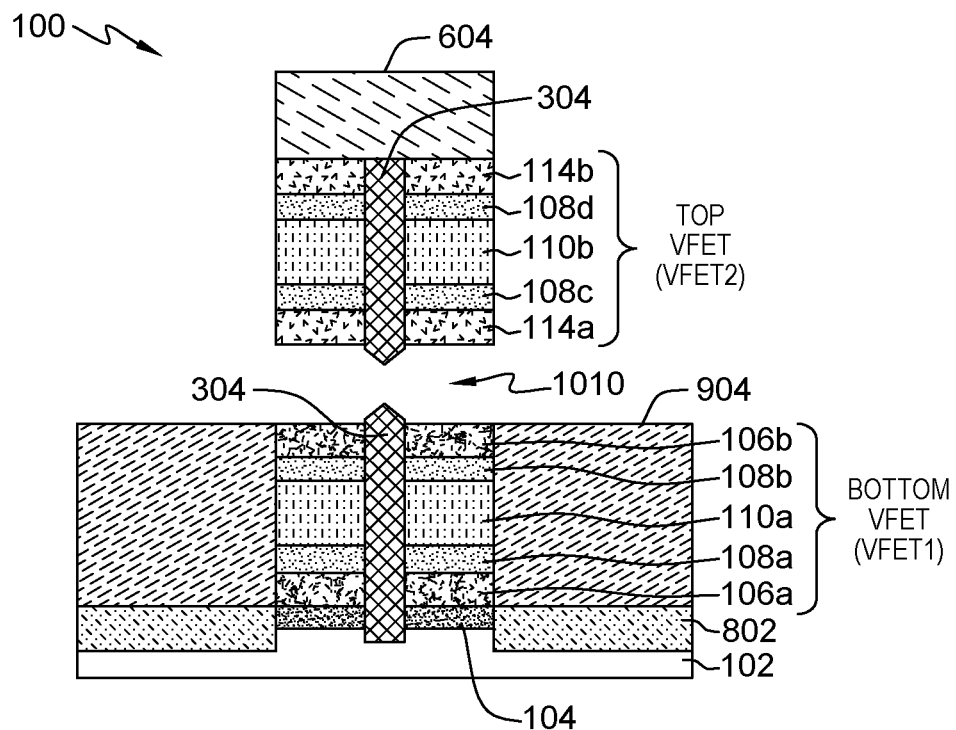
FIG. 10A is a front view of the semiconductor structure depicting selectively removing a second sacrificial layer from an area located between the first VFET device and a second VFET device, according to an embodiment of the present disclosure.
Figure 10B:
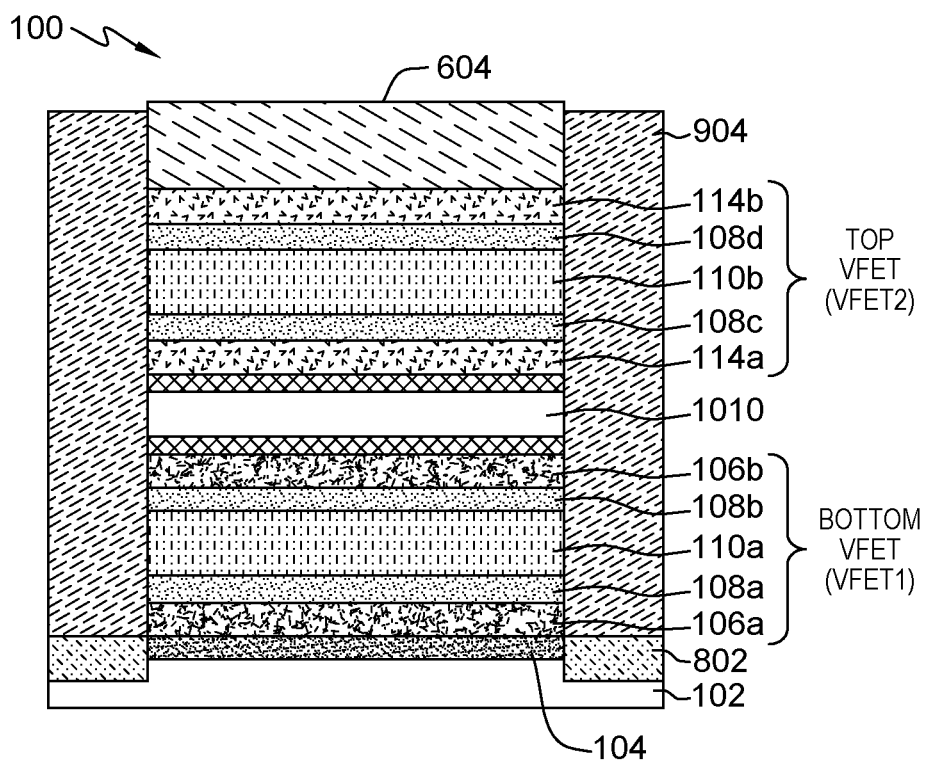
FIG. 10B is a lateral view of FIG. 10A, according to an embodiment of the present disclosure.

Referring now to FIG. 10A, a front view of the semiconductor structure 100 is shown depicting selectively removing the second sacrificial layer 112 (FIGS. 9A-9B) from an area located between the bottom VFET (VFET1) and the top VFET (VFET2), according to an embodiment of the present disclosure. FIG. 10B is a lateral view of the semiconductor structure 100.

The second sacrificial layer 112 (FIGS. 9A-9B) may be selectively removed by using a wet etch chemistry that etches faster on a {100} plane than on a {111} plane. As known by those skilled in the art, chemical reaction rates can be different on different crystal planes. Thus, certain etchants (e.g., KOH) may exhibit a reaction rate on {100} planes that is much faster than the {111} planes. As a result, a square etch window on a {100} silicon (Si) surface may become an inverse pyramid at some point. As can be appreciated in the figures, after removing the second sacrificial layer 112 (FIGS. 9A-9B), a recess 1010 is formed in the semiconductor structure 100 which exposes portions of the fin 304 that now exhibit the inverse pyramid shape previously explained.

Figure 11A:
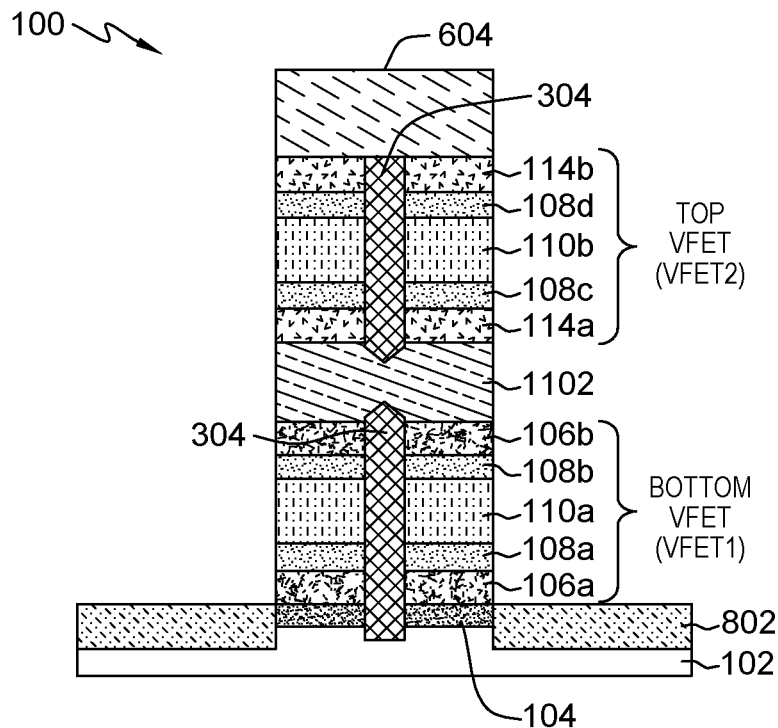
FIG. 11A is a front view of the semiconductor structure depicting forming a second oxide layer between the first VFET and the second VFET after removing the second sacrificial layer, according to an embodiment of the present disclosure.
Figure 11B:
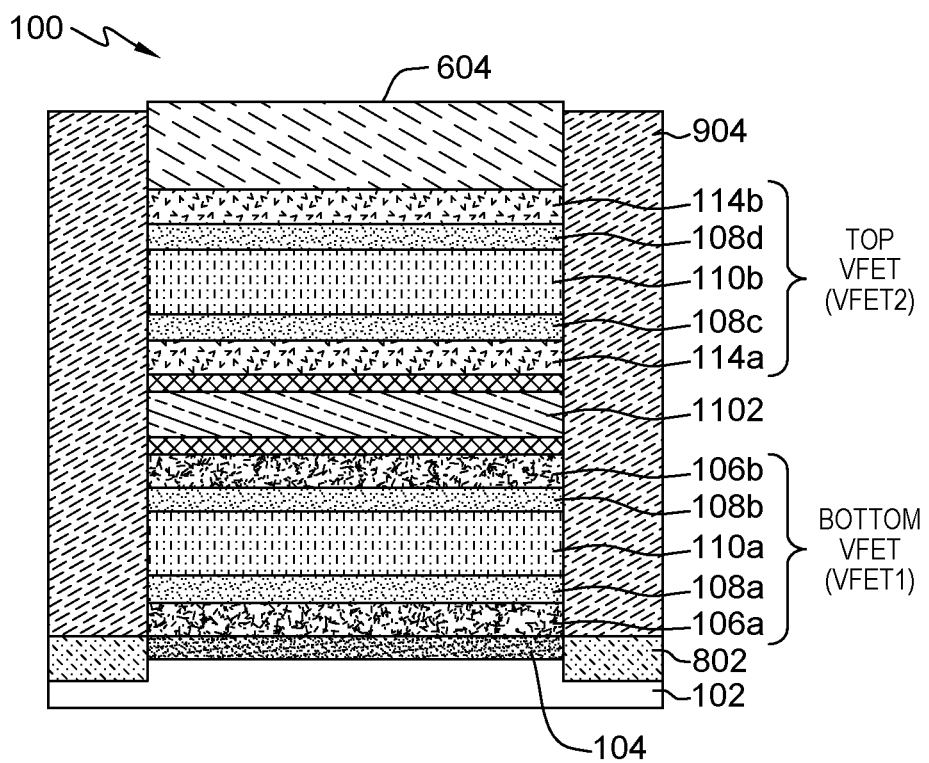
FIG. 11B is a lateral view of FIG. 11A, according to an embodiment of the present disclosure.

Referring now to FIG. 11A, a front view of the semiconductor structure 100 is shown depicting the formation of a second oxide layer 1102 in a region between the bottom VFET and the top VFET, according to an embodiment of the present disclosure. Specifically, the recess 1010 (FIGS. 10A-10B) is filled with the second oxide layer 1102. The process of filling the recess 1010 (FIGS. 10A-10B) may include depositing an oxide material similar to the oxide material used to form the first oxide layer 904 by, for example, ALD.

After depositing the second oxide layer 1102 in the area between the bottom VFET and the top VFET (i.e., recess 1010 in FIGS. 10A-10B), the second oxide layer 1102 is selectively removed (e.g., using RIE) from the semiconductor structure 100 to expose the bottom VFET, as shown in the figures.

Figure 12:
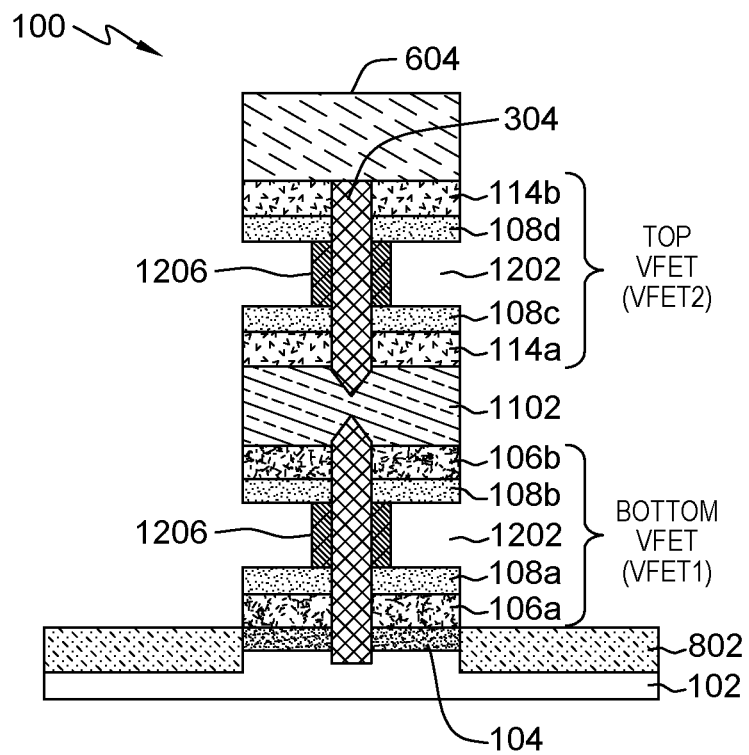
FIG. 12 is a front view of the semiconductor structure depicting removing a first sacrificial layer from the semiconductor structure to form a high-dielectric layer, according to an embodiment of the present disclosure.

Referring now to FIG. 12, the first and third sacrificial layers 110a, 110b are removed from the semiconductor structure 100 to form a high-k dielectric layer 1202, according to an embodiment of the present disclosure. Any suitable etching technique may be used to remove the first and third sacrificial layers 110a, 110b.

After removal of the first and third sacrificial layers 110a, 110b, the high-k dielectric layer 1202 may be formed in direct contact with portions of the fin 304 in the bottom VFET and top VFET, respectively. Any suitable deposition method known in the art may be used to form the high-k dielectric layer 1202 including, for example, CVD, PECVD, ALD, evaporation, reactive sputtering, chemical solution deposition or other like deposition processes. Generally, the high-k dielectric layer 1202 includes a high-k material including, but not limited to, $HfO_2$ (hafnium oxide), $ZrO_2$ (zirconium dioxide), hafnium zirconium oxide $Al_2O_3$ (aluminum oxide), and $Ta_2O_5$ (tantalum pentoxide). A thickness of the high-k dielectric layer 1202 may vary, but typically may have a (horizontal) thickness ranging from approximately 1 nm to approximately 3 nm.

Figure 13:
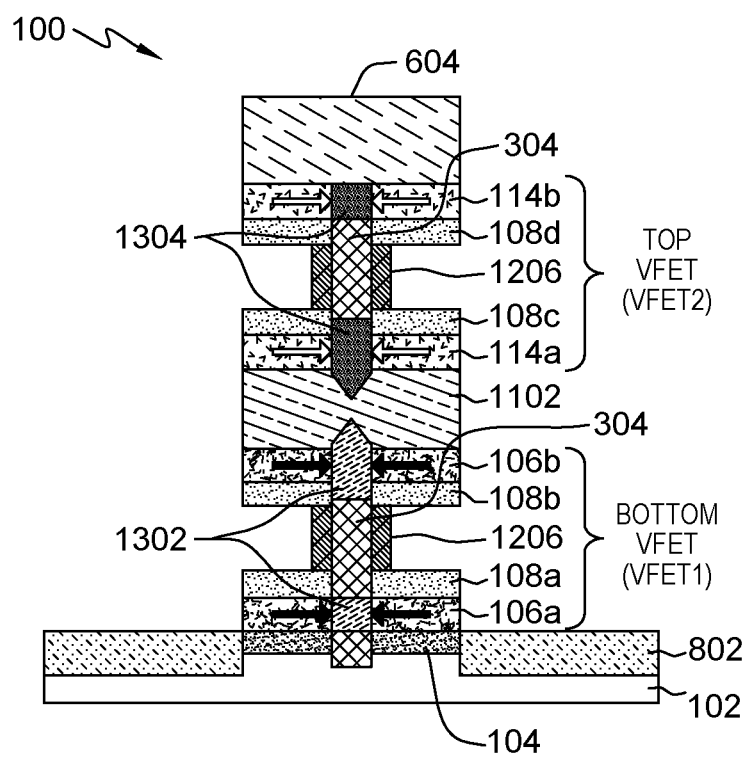
FIG. 13 is a front view of the semiconductor structure depicting annealing the semiconductor structure to drive dopants and form source-drain regions, according to an embodiment of the present disclosure.

Referring now FIG. 13, a thermal annealing process is conducted on the semiconductor structure 100 to form bottom source-drain regions 1302 for the bottom VFET and top source-drain regions 1304 for the top VFET, according to an embodiment of the present disclosure. The semiconductor structure 100 is subjected to a high temperature anneal using conventional processes, such as rapid thermal annealing (RTA). The annealing temperature may vary from approximately 400° C. to approximately 1000° C., although other temperatures above or below this range may also be considered.

According to an embodiment, during the thermal annealing process ions of n-type or p-type dopants from the first bottom dopant layer 106a, first top dopant layer 106b, second bottom dopant layer 114a, and second top dopant layer 114b migrate into corresponding bottom and top portions of the fin 304 in the bottom VFET (VFET1) and top VFET (VFET2), as indicated by the arrows in FIG. 13. Suitable n-type dopants include, but are not limited to, phosphorous (P) and/or arsenic (As), and suitable p-type dopants include, but are not limited to, boron (B). The polarity of the dopant (n-type or p-type) for the top source-drain regions 1304 varies depending on whether the bottom VFET is an NFET device or PFET device.

For example, in embodiments in which the bottom VFET is an NFET device, the first bottom and top dopant layers 106a, 106b may be a phosphosilicate glass (PSG) or an arsenic silicate glass (ASG) capable of providing the appropriate n-type dopants to form the bottom source-drain regions 1302, in such embodiments the top VFET is a PFET device having second bottom and top dopant layers 114a, 114b made of a borosilicate glass (BSG) capable of providing appropriate p-type dopants to form the top bottom source-drain regions 1304.

On the other hand, in embodiments in which the bottom VFET is a PFET device, the first bottom and top dopant layers 106a, 106b may be a borosilicate glass (BSG) capable of providing appropriate p-type dopants to form the bottom source-drain regions 1302, in such embodiments the top VFET is an NFET device having second bottom and top dopant layers 114a, 114b made of a phosphosilicate glass (PSG) or an arsenic silicate glass (ASG) capable of providing the appropriate n-type dopants to form the top bottom source-drain regions 1304.

As known by those skilled in the art, a first portion of the fin 304 between bottom source-drain regions 1302 will serve as vertical fin channel of the bottom VFET in the stack, while a second portion of the fin 304 between top source-drain regions 1304 will serve as vertical fin channel of the top VFET in the stack.

Figure 14:
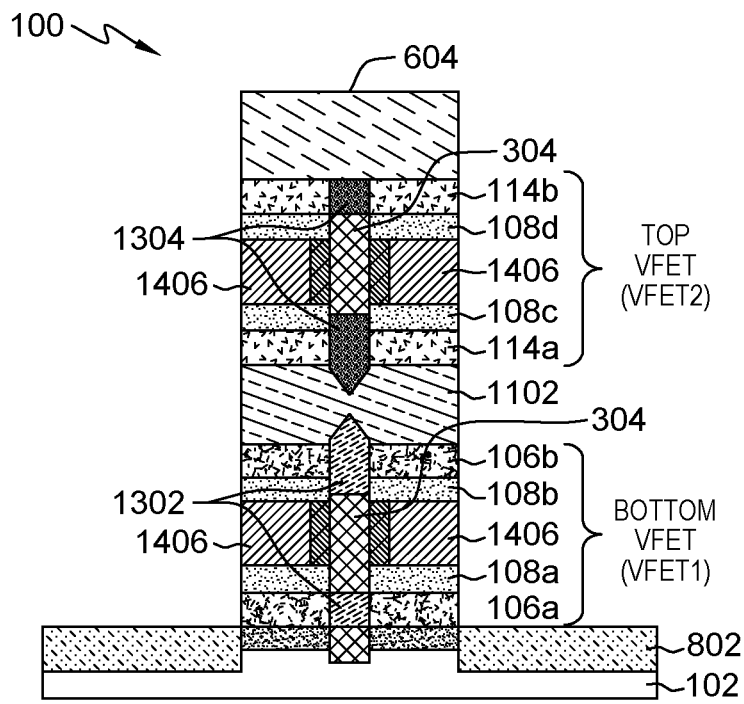
FIG. 14 is a front view of the semiconductor structure depicting forming a first metal gate layer above the high-k dielectric layer, according to an embodiment of the present disclosure.

Referring now to FIG. 14, a first gate metal layer 1406 is formed above the high-k dielectric layer 1202, according to an embodiment of the present disclosure. The first gate metal layer 1406 may include a p-type or n-type work function metal deposited using standard deposition techniques including, but not limited to, CVD, PVD, PECVD, or ALD. The polarity of the work function metal forming the first gate metal layer 1406 is selected based on whether the bottom VFET is an NFET or PFET device. In the case of an NFET, the first gate metal layer 1406 includes a n-type work function metal. On the other hand, in the case of a PFET, the first gate metal layer 1406 includes a p-type work function metal.

Suitable p-type work function metals to form the first gate metal layer 1406 may include, for example, titanium nitride (TiN), tantalum nitride (TaN) or ruthenium (Ru), and suitable n-type work function metals may include, for example, TiN, titanium aluminum nitride (TiAlN), titanium aluminum carbon nitride (TiAlCN), titanium carbide (TiC), titanium aluminum carbide (TiAlC), tantalum aluminum carbide (TaAlC), tantalum aluminum carbon nitride (TaAlCN) or lanthanum (La) doped TiN, TaN.

A thickness of the first gate metal layer 1406 may vary, but typically may have a (horizontal) thickness ranging from approximately 4 nm to approximately 20 nm.

It should be noted that although the first metal gate layer 1406 is formed in both bottom and top VFETs, it corresponds to the bottom VFET only. As known by those skilled in the art, a metal gate layer of the top VFET requires a different polarity than the bottom VFET. Namely, in embodiments in which the bottom VFET is an NFET device, the first metal gate layer 1406 includes an n-type work function metal, and the top VFET is a PFET device with a second metal gate layer 1604 (FIG. 16) including a p-type work function metal, and vice versa. As will be described in detail below, the first metal gate layer 1406 is removed from the top VFET and replaced with an appropriate work function metal.

Figure 15:
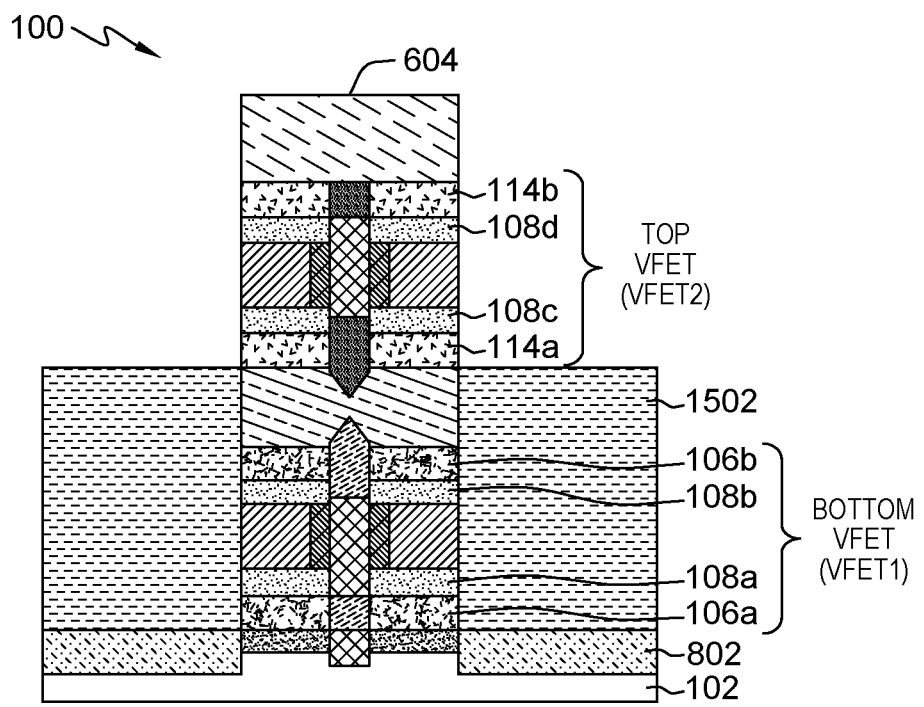
FIG. 15 is a front view of the semiconductor structure depicting forming a third oxide layer to cover the first VFET, according to an embodiment of the present disclosure.

Referring now to FIG. 15, a third oxide layer 1502 is formed on the semiconductor structure 100 to cover the bottom VFET, according to an embodiment of the present disclosure. The third oxide layer 1502 may protect the bottom VFET device during removal of the first gate metal layer 1406 from the top VFET. The third oxide layer 1502 may include similar materials and may be formed similarly to the first oxide layer 904 (FIGS. 9A-9B) and second oxide layer 1102 (FIGS. 11A-11B), described above.

Figure 16:
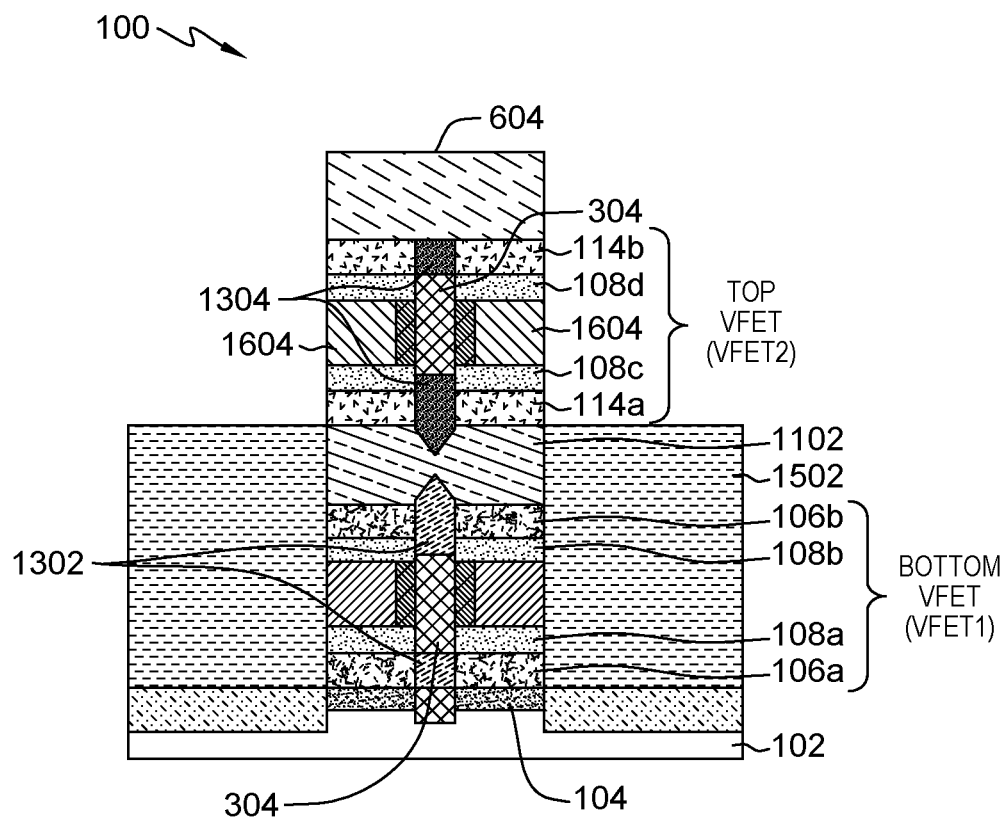
FIG. 16 is a front view of the semiconductor structure depicting replacing the first metal gate layer with a second metal gate layer, according to an embodiment of the present disclosure.

Referring now to FIG. 16, the first metal gate layer 1406 is replaced in the top VFET (VFET2) with a second metal gate layer 1604, according to an embodiment of the present disclosure. The second metal gate layer 1604 is formed in direct contact with the gate dielectric layer 1206 in the top VFET, and may include a p-type or n-type work function metal selected based on a polarity of the bottom VFET.

As mentioned above, in embodiments in which the bottom VFET is an NFET device, the top VFET is a PFET device with second metal gate layer 1604 including a p-type work function metal. In contrast, in embodiments in which the bottom VFET is a PFET device, the top VFET is an NFET device with second metal gate layer 1604 including an n-type work function metal.

Similar to the first gate metal layer 1406, suitable p-type work function metals to form the second gate metal layer 1604 may include, for example, titanium nitride (TiN), tantalum nitride (TaN) or ruthenium (Ru), and suitable n-type work function metals may include, for example, TiN, titanium aluminum nitride (TiAlN), titanium aluminum carbon nitride (TiAlCN), titanium carbide (TiC), titanium aluminum carbide (TiAlC), tantalum aluminum carbide (TaAlC), tantalum aluminum carbon nitride (TaAlCN) or lanthanum (La) doped TiN, TaN. A thickness of the second gate metal layer 1604 may vary, but typically may have a (horizontal) thickness ranging from approximately 4 nm to approximately 20 nm.

Following the formation of the second gate metal layer 1604, the third oxide layer 1502 may be removed from the semiconductor structure 100 using standard techniques.

Figure 17A:
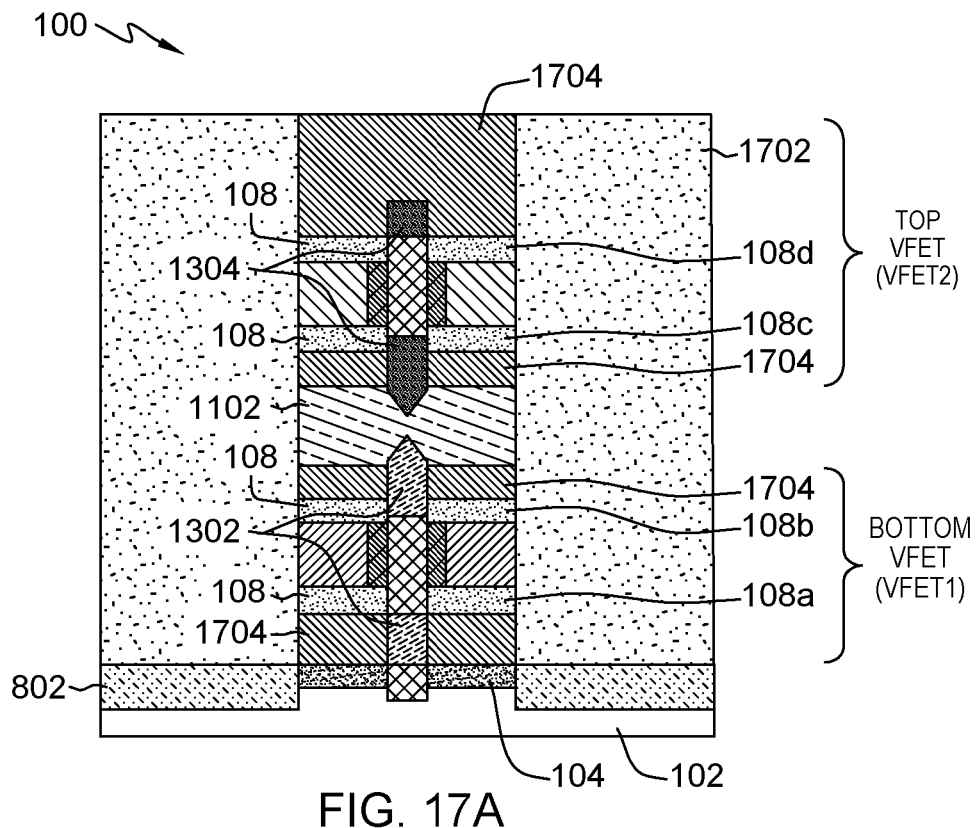
FIG. 17A is a front view of the semiconductor structure depicting forming metal contacts, according to an embodiment of the present disclosure.
Figure 17B:
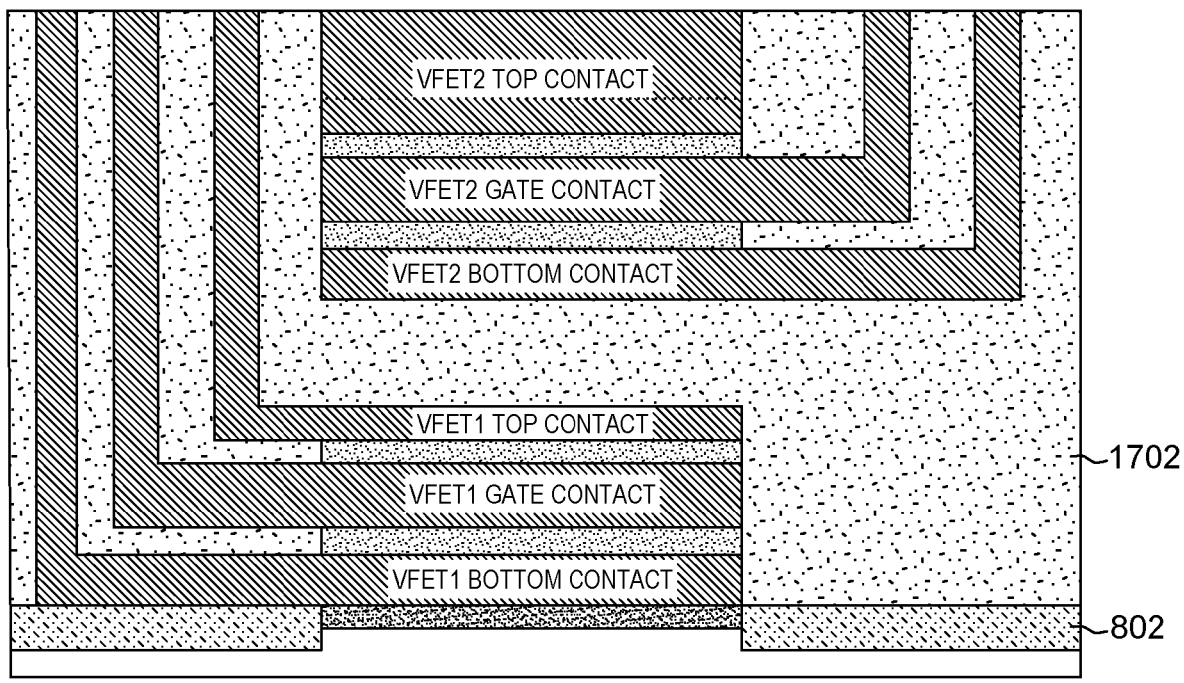
FIG. 17B is a lateral view of FIG. 17A, according to an embodiment of the present disclosure.

Referring now to FIG. 17A, a front view of the semiconductor structure 100 is shown depicting the formation of metal contacts 1704, according to an embodiment of the present disclosure. FIG. 17B is a lateral view of the semiconductor structure 100. Specifically, metal contacts 1704 to corresponding source-drain regions and metal gates in the top and bottom VFETs are formed in the semiconductor structure 100. The process of forming metal contacts is well-known in the art, and may include forming an interlevel dielectric (ILD) 1702 in the semiconductor structure 100. It should be noted that prior to forming the metal contacts 1704, the hard mask 604 is removed from the semiconductor structure 100.

According to an embodiment, metal contacts 1704 to source-drain regions 1302 in the bottom VFET (e.g., VFET1 bottom contact and VFET1 top contact) and source-drain regions 1304 in the top VFET (e.g., VFET2 bottom contact and VFET2 top contact) may be formed by removing the first bottom dopant layer 106a, first top dopant layer 106b, second bottom dopant layer 114a, and second top dopant layer 114b from the semiconductor structure 100.

An isotropic (non-directional) etching process may be used to remove the first bottom dopant layer 106a, first top dopant layer 106b, second bottom dopant layer 114a, and second top dopant layer 114b from the semiconductor structure 100. The first bottom dopant layer 106a, first top dopant layer 106b, second bottom dopant layer 114a, and second top dopant layer 114b may be replaced with a first contact metal (not shown) to form the metal contacts 1704 to the bottom source-drain regions 1302 (VFET1) and the top source-drain regions 1304 (VFET2). The first contact metal forming the metal contacts 1704 may include, but is not limited, to titanium (Ti), copper (Cu), nickel (Ni), platinum (Pt) and/or tungsten (W), and may be deposited using a conformal deposition process such as ALD. As can be appreciated in FIG. 17A, the metal contacts 1704 can access bottom source-drain regions 1302 of the bottom VFET and top source-drain regions 1304 of the top VFET.

As depicted in FIG. 17B, metal contacts 1704 having access to the first gate metal layer 1406 of the bottom VFET and the second gate metal layer 1604 of the top VFET may be formed using standard lithography and etching techniques to pattern contact trenches (not shown) in the ILD 1702. A directional etching process such as RIE is suitable for the contact trench etch. The contact trenches (not shown) may expose the first gate metal layer 1406 of the bottom VFET and the second gate metal layer 1604 of the top VFET. The contact trenches may then be filled with a second contact metal forming a gate contact in the bottom VFET (e.g., VFET1 gate contact) and a gate contact in the top VFET (e.g., VFET2 gate contact). The second contact metal may include, but is not limited, to Cu, Ni, Pt and/or W and may be deposited using a conformal deposition process such as ALD.

Therefore, embodiments of the present disclosure provide a method of forming stacked VFET devices with pre-defined spacers and p-n junction positions. Specifically, the proposed method allows defining and controlling p-n junction position, channel length and spacer thickness during initial processing steps. This may in turn improve device symmetry, simplify the manufacturing process, and facilitate the stacking of multiple VFET devices.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor structure, the method comprising:
    forming a trench within a plurality of layers stacked on a semiconductor substrate, the plurality of layers comprising a sequence of dielectric materials, the trench extends through each layer of the plurality of layers until a top portion of the semiconductor substrate, a first portion of the plurality of layers corresponds to a bottom vertical field effect transistor (VFET) and a second portion of the plurality of layers corresponds to a top VFET, the top VFET is separated from the bottom VFET by a second sacrificial layer;
    epitaxially growing a semiconductor material within the trench, the semiconductor material substantially fills the trench to form a fin;
    forming a hard mask layer above a central top portion of the plurality of layers, the hard mask layer covers the fin;
    removing portions of the plurality of layers outside the hard mask layer such that a width of a remaining portion of the plurality of layers below the hard mask layer is equal to a width of the hard mask, wherein removing the portions of the plurality of layers outside the hard mask layer continues until a top portion of the semiconductor substrate is recessed;
    forming shallow trench isolation regions on the recessed top portion of the semiconductor substrate, the shallow trench isolation regions being adjacent to the remaining plurality of layers;
    covering the first portion of the plurality of layers associated with the bottom VFET;
    removing the second sacrificial layer, wherein removing the second sacrificial layer creates a recess between the bottom VFET and the top VFET; and
    depositing an oxide layer to fill the recess.

2. The method of claim 1, wherein the sequence of dielectric materials comprises:
    a bottom dielectric layer above the semiconductor substrate;
    the first portion of the plurality of layers associated with the bottom VFET comprising:
        a first bottom dopant layer directly above the bottom dielectric layer,
        a first bottom spacer layer directly above the first bottom dopant layer,
        a first sacrificial layer directly above the first bottom spacer layer,
        a first top spacer layer directly above the first sacrificial layer, and
        a first top dopant layer directly above the first top spacer layer;
    the second sacrificial layer directly above the first top dopant layer, the second sacrificial layer separates the bottom VFET from the top VFET; and
    the second portion of the plurality of layers associated with the top VFET comprising:
        a second bottom dopant layer directly above the second sacrificial layer,
        a second bottom spacer directly above the second bottom dopant layer,
        a third sacrificial layer directly above the second bottom spacer,
        a second top spacer layer directly above the third sacrificial layer, and
        a second top dopant layer directly above the second top spacer layer.

3. The method of claim 2, wherein the bottom VFET is an NFET device in which the first bottom dopant layer and the first top dopant layer are made of a phosphosilicate glass (PSG) or an arsenic silicate glass (ASG), and the top VFET is a PFET device in which the second bottom dopant layer and second top dopant layer are made of a borosilicate glass (BSG).

4. The method of claim 2, wherein the bottom VFET is a PFET device in which the first bottom dopant layer and the first top dopant layer are made of a borosilicate glass (BSG), and the top VFET is an NFET device in which the second bottom dopant layer and the second top dopant layer are made of a phosphosilicate glass (PSG) or an arsenic silicate glass (ASG).

5. The method of claim 2, further comprising:
removing the first sacrificial layer and the third sacrificial layer to expose a top surface of the fin;
forming a high-k dielectric in direct contact with the exposed top surface of the fin.

6. The method of claim 5, further comprising:
depositing a first metal gate layer directly above the high k-dielectric.

7. The method of claim 6, further comprising:
covering the first portion of the plurality of layers corresponding to the bottom VFET; and
replacing the first metal gate layer in the top VFET with a second metal gate layer.

8. The method of claim 7, further comprising:
removing each of the first bottom dopant layer, the first top dopant layer, the second bottom dopant layer, and the second top dopant layer from the plurality of layers to form metal contacts.

9. The method of claim 2, further comprising:
annealing the semiconductor structure to drive dopants from the first bottom dopant layer, the first top dopant layer, the second bottom dopant layer, and the second top dopant layer into corresponding top and bottom portions of the fin to form source-drain regions of the bottom VFET and the top VFET.

10. The method of claim 1, wherein forming the hard mask layer comprises:
forming an upper sacrificial layer on the plurality of layers and the fin;
selectively removing a central portion of the upper sacrificial layer, wherein removing the central portion creates a space between remaining outer portions of the upper sacrificial layer;
depositing the hard mask layer in the space; and
removing the remaining outer portions of the upper sacrificial layer.

11. The method of claim 1, wherein the second sacrificial layer is removed by a wet chemistry etching technique that selectively etches faster on a {100} plane than a {111} plane.

12. A semiconductor structure comprising:
a bottom vertical field effect transistor (VFET) disposed on a semiconductor substrate, the bottom VFET comprising:
a first fin channel located between a first top source-drain region and a first bottom source-drain region,
a first high-k dielectric in direct contact with the first fin channel,
a first metal gate directly above the first high-k dielectric, and
a first bottom dopant layer in direct contact with the first bottom source-drain region and a first top dopant layer in direct contact with the first top source-drain region, the first bottom dopant layer and the first top dopant layer separated from the first metal gate by a first spacer material; and
a top VFET disposed above the bottom VFET, the top VFET separated from the bottom VFET by an oxide layer, the top VFET comprising:
a second fin channel located between a second top source-drain region and a second bottom source-drain region,
a second high-k dielectric directly above the second fin channel,
a second metal gate directly above the second high-k dielectric, and
a second bottom dopant layer above the oxide layer in direct contact with the second bottom source-drain region and a second top dopant layer in direct contact with the second bottom source-drain region, the second top dopant layer and the second bottom dopant layer separated from the second metal gate by a second spacer material,
each of the first top source-drain region of the bottom VFET and the second bottom source-drain region of the top VFET having a triangular shape with an upwardly-pointed tip extending towards the oxide layer.

13. The semiconductor structure of claim 12, wherein the bottom VFET further comprises:
a bottom dielectric layer above the semiconductor substrate and below the first bottom source-drain regions of the bottom; VFET, wherein the first bottom dopant layer is located directly above the bottom dielectric layer between shallow trench isolation regions, and the first spacer material is positioned between the first bottom dopant layer and the first metal gate and between the first metal gate and the first top dopant layer.

14. The semiconductor structure of claim 12, wherein the second spacer material is positioned between the second bottom dopant layer and the second metal gate and between the second metal gate and the second top dopant layer.

15. The semiconductor structure of claim 12, wherein the bottom VFET is an NFET device in which the first bottom dopant layer and the first top dopant layer are made of a phosphosilicate glass (PSG) or an arsenic silicate glass (ASG).

16. The semiconductor structure of claim 12, wherein the top VFET is a PFET device in which the second bottom dopant layer and the second top dopant layer are made of a borosilicate glass (BSG).

17. The semiconductor structure of claim 12, wherein the bottom VFET is PFET device in which the first bottom dopant layer and the first top dopant layer are made of a borosilicate glass (BSG).

18. The semiconductor structure of claim 12, wherein the top VFET is an NFET device in which the second bottom dopant layer and the second top dopant layer are made of a phosphosilicate glass (PSG) or an arsenic silicate glass (ASG).

* * * * *